US011008153B2

(12) United States Patent
Reid

(10) Patent No.: US 11,008,153 B2
(45) Date of Patent: May 18, 2021

(54) MULTIPLY-INSULATED ASSEMBLIES

(71) Applicant: CONCEPT GROUP LLC, Wellesley, MA (US)

(72) Inventor: Aarne H. Reid, Jupiter, FL (US)

(73) Assignee: Concept Group LLP, Wellesley, MA (US)

( * ) Notice: Subject to any disclaimer, the term of this patent is extended or adjusted under 35 U.S.C. 154(b) by 145 days.

(21) Appl. No.: 16/461,192

(22) PCT Filed: Nov. 14, 2017

(86) PCT No.: PCT/US2017/061529
§ 371 (c)(1),
(2) Date: May 15, 2019

(87) PCT Pub. No.: WO2018/093773
PCT Pub. Date: May 24, 2018

(65) Prior Publication Data
US 2019/0291941 A1 Sep. 26, 2019

Related U.S. Application Data

(60) Provisional application No. 62/422,190, filed on Nov. 15, 2016.

(51) Int. Cl.
*B65D 81/38* (2006.01)
*A47J 41/02* (2006.01)
*B32B 1/02* (2006.01)
*B32B 15/04* (2006.01)
*B32B 15/20* (2006.01)
(Continued)

(52) U.S. Cl.
CPC .......... *B65D 81/3853* (2013.01); *A47J 41/02* (2013.01); *A47J 41/022* (2013.01); *B32B 1/02* (2013.01); *B32B 15/04* (2013.01); *B32B 15/20* (2013.01); *B65D 81/3858* (2013.01); *H01B 7/29* (2013.01); *H01B 17/36* (2013.01); *H05K 5/0213* (2013.01);
(Continued)

(58) Field of Classification Search
CPC .. B65D 81/3853; B65D 81/3858; B32B 1/02; B32B 15/04; B32B 15/20; B32B 2307/304; B32B 2439/00; A47J 41/02; A47J 41/022; H01B 7/29; H01B 17/36; H05K 5/0213; H05K 5/0247
USPC ...................................... 174/17 VA
See application file for complete search history.

(56) References Cited

U.S. PATENT DOCUMENTS 1,362,805 A 12/1920 Kruse
1,457,504 A 6/1923 Cullen et al.
(Continued)

FOREIGN PATENT DOCUMENTS

CN 102072363 A 5/2011
CN 202001825 U 10/2011
(Continued)

OTHER PUBLICATIONS

Multifoil Insulation; 1 page;year 2011.
(Continued)

*Primary Examiner* — Tuan N Nguyen
(74) *Attorney, Agent, or Firm* — BakerHostetler

(57) ABSTRACT

Provided are multiply-insulated articles, comprising at least first and second containers disposed together such that the interior volume of the first container is sealed against the environment exterior to the article.

26 Claims, 9 Drawing Sheets

(51) Int. Cl.
  *H05K 5/02* (2006.01)
  *H01B 7/29* (2006.01)
  *H01B 17/36* (2006.01)

(52) U.S. Cl.
  CPC ...... *H05K 5/0247* (2013.01); *B32B 2307/304* (2013.01); *B32B 2439/00* (2013.01)

(56) References Cited

U.S. PATENT DOCUMENTS

| | | |
|---|---|---|
| 2,085,737 A | 7/1937 | Cereghino |
| 2,225,660 A | 12/1940 | Rogers |
| 2,362,893 A | 11/1944 | Durst |
| 2,363,893 A | 11/1944 | Monier |
| 2,573,594 A | 10/1951 | Nofzinger |
| 2,666,979 A | 1/1954 | Van Dusen |
| 2,722,336 A | 11/1955 | Aaron et al. |
| 2,807,074 A | 9/1957 | Schroeder |
| 2,845,199 A | 7/1958 | Putman et al. |
| 2,867,242 A | 1/1959 | Harris et al. |
| 3,119,238 A | 1/1964 | Chamberlain et al. |
| 3,146,005 A | 8/1964 | Peyton |
| 3,152,452 A | 10/1964 | Bond et al. |
| 3,195,564 A | 7/1965 | Carney et al. |
| 3,265,236 A | 8/1966 | Norman et al. |
| 3,460,512 A | 8/1969 | Keichler et al. |
| 3,510,323 A | 5/1970 | Wismer et al. |
| 3,706,208 A | 12/1972 | Kadi et al. |
| 3,736,936 A | 6/1973 | Basiulis et al. |
| 3,760,142 A | 9/1973 | Schoenthaler |
| 3,799,440 A | 3/1974 | Goss et al. |
| 3,988,029 A | 10/1976 | Gibson |
| 4,055,268 A | 10/1977 | Barthel |
| 4,117,201 A | 9/1978 | Keifert |
| 4,157,779 A | 6/1979 | Arashi et al. |
| 4,200,199 A | 4/1980 | Perkins et al. |
| 4,332,401 A | 6/1982 | Stephenson et al. |
| 4,396,211 A | 8/1983 | McStravick et al. |
| 4,399,919 A | 8/1983 | Posnansky et al. |
| 4,450,872 A | 5/1984 | Orcutt |
| 4,491,347 A | 1/1985 | Gustafson |
| 4,515,397 A | 5/1985 | Nowobilski et al. |
| 4,538,337 A | 9/1985 | Holbrook et al. |
| 4,653,469 A | 3/1987 | Miyaji et al. |
| 4,696,104 A | 9/1987 | Vanzetti et al. |
| 4,746,054 A | 5/1988 | Moats et al. |
| 4,758,222 A | 7/1988 | McCoy |
| 4,838,859 A | 6/1989 | Strassmann |
| 4,903,631 A | 2/1990 | Morris |
| 4,919,299 A | 4/1990 | Haines |
| 4,997,124 A | 3/1991 | Kitabatake et al. |
| 5,038,706 A | 8/1991 | Morris |
| 5,052,816 A | 10/1991 | Nakamura et al. |
| 5,108,390 A | 4/1992 | Potocky et al. |
| 5,206,705 A | 4/1993 | Tokura |
| 5,235,817 A | 8/1993 | Gallagher et al. |
| 5,285,559 A | 2/1994 | Thompson et al. |
| 5,411,897 A | 5/1995 | Harvey et al. |
| 5,520,682 A | 5/1996 | Baust et al. |
| 5,524,630 A | 6/1996 | Crowley |
| 5,562,154 A | 10/1996 | Benson et al. |
| 5,573,140 A | 11/1996 | Satomi et al. |
| 5,573,532 A | 11/1996 | Chang et al. |
| 5,600,752 A | 2/1997 | Lopatinsky |
| 5,650,020 A | 7/1997 | Ohta et al. |
| 5,674,218 A | 10/1997 | Rubinsky et al. |
| 5,742,048 A | 4/1998 | Kobayashi et al. |
| 5,756,934 A * | 5/1998 | Purdom ............ H05K 5/0213 174/544 |
| 5,862,973 A | 1/1999 | Wasserman |
| 5,869,801 A | 2/1999 | Paton et al. |
| 5,870,823 A | 2/1999 | Bezama et al. |
| 6,050,443 A | 4/2000 | Tung |
| 6,095,405 A | 8/2000 | Kim et al. |
| 6,109,518 A | 8/2000 | Mueller et al. |
| 6,139,571 A | 10/2000 | Fuller et al. |
| 6,145,547 A | 11/2000 | Villatte |
| 6,166,907 A | 12/2000 | Chien |
| 6,186,390 B1 | 2/2001 | Tadauchi et al. |
| 6,216,745 B1 | 4/2001 | Augustynowicz et al. |
| 6,360,935 B1 | 3/2002 | Flake |
| 6,706,037 B2 | 3/2004 | Zvuloni et al. |
| 6,755,823 B2 | 6/2004 | Lalonde |
| 6,875,209 B2 | 4/2005 | Zvuloni et al. |
| 6,936,045 B2 | 8/2005 | Yu et al. |
| 7,064,429 B2 | 6/2006 | Bemmerl et al. |
| 7,139,172 B2 | 11/2006 | Bezama et al. |
| 7,150,743 B2 | 12/2006 | Zvuloni et al. |
| 7,203,064 B2 | 4/2007 | Mongia et al. |
| 7,207,985 B2 | 4/2007 | Duong et al. |
| 7,258,161 B2 | 8/2007 | Cosley et al. |
| 7,298,623 B1 | 11/2007 | Kuczynski et al. |
| RE40,049 E | 2/2008 | Li |
| 7,334,630 B2 | 2/2008 | Goodson et al. |
| 7,354,434 B2 | 4/2008 | Zvuloni et al. |
| 7,356,434 B2 | 4/2008 | Wu et al. |
| 7,361,187 B2 | 4/2008 | Duong et al. |
| 7,374,063 B2 | 5/2008 | Reid |
| 7,393,350 B2 | 7/2008 | Maurice |
| 7,419,085 B2 | 9/2008 | Fukunaka et al. |
| 7,451,785 B2 | 11/2008 | Taira et al. |
| 7,460,369 B1 | 12/2008 | Blish, II |
| 7,485,117 B2 | 2/2009 | Damasco et al. |
| 7,497,365 B2 | 3/2009 | Kimura et al. |
| 7,510,534 B2 | 3/2009 | Burdorff et al. |
| 7,515,415 B2 | 4/2009 | Monfarad et al. |
| 7,608,071 B2 | 10/2009 | Duong et al. |
| 7,621,889 B2 | 11/2009 | Duong et al. |
| 7,621,890 B2 | 11/2009 | Duong et al. |
| 7,681,299 B2 | 3/2010 | Reid |
| 7,909,227 B2 | 3/2011 | Duong et al. |
| 7,980,171 B2 | 7/2011 | Groll |
| 8,231,613 B2 | 7/2012 | Baxter et al. |
| 8,353,332 B2 | 1/2013 | Reid |
| 8,434,665 B2 | 5/2013 | Motomura et al. |
| 9,243,726 B2 | 1/2016 | Reid |
| 9,463,918 B2 | 10/2016 | Reid |
| 9,874,303 B2 | 1/2018 | Reid |
| 2001/0030225 A1 | 10/2001 | Nagata |
| 2002/0114937 A1 | 8/2002 | Albert et al. |
| 2003/0079554 A1 | 5/2003 | Van Cleve |
| 2003/0146224 A1 | 8/2003 | Fujii et al. |
| 2004/0116851 A1 | 6/2004 | Johansen et al. |
| 2004/0129756 A1 | 7/2004 | Zakel et al. |
| 2004/0181136 A1 | 9/2004 | McDaniel et al. |
| 2004/0226979 A1 | 11/2004 | Sato et al. |
| 2005/0211711 A1 | 9/2005 | Reid |
| 2006/0054234 A1 | 3/2006 | White |
| 2006/0054243 A1 | 3/2006 | Walton |
| 2006/0061092 A1 | 3/2006 | Keyes |
| 2006/0071052 A1 | 4/2006 | Conlon et al. |
| 2006/0076389 A1 | 4/2006 | Kemper et al. |
| 2006/0086773 A1 | 4/2006 | Sanftleben et al. |
| 2006/0282039 A1 | 12/2006 | Duong et al. |
| 2007/0102477 A1 | 5/2007 | Prince |
| 2007/0102478 A1 | 5/2007 | Prince |
| 2007/0235497 A1 | 10/2007 | Hsu |
| 2007/0235498 A1 | 10/2007 | Hsu |
| 2007/0235499 A1 | 10/2007 | Hsu |
| 2007/0246510 A1 | 10/2007 | Hsu |
| 2008/0006598 A1 | 1/2008 | Fujii et al. |
| 2008/0036076 A1 | 2/2008 | Ouyang |
| 2008/0061111 A1 | 3/2008 | Kiriyama |
| 2008/0083816 A1 | 4/2008 | Leinbach et al. |
| 2008/0121642 A1 | 5/2008 | Reid |
| 2008/0147055 A1 | 6/2008 | Duong et al. |
| 2008/0169037 A1 | 7/2008 | Ziegler |
| 2008/0197170 A1 | 8/2008 | Prince |
| 2008/0285230 A1 | 11/2008 | Bojan et al. |
| 2009/0031659 A1 | 2/2009 | Kalfon |
| 2009/0065499 A1 | 3/2009 | England |
| 2009/0068070 A1 | 3/2009 | Hashimoto et al. |
| 2009/0123221 A1 | 5/2009 | Marshall |
| 2009/0152331 A1 | 6/2009 | Schmitt et al. |
| 2010/0057064 A1 | 3/2010 | Baust et al. |

(56) References Cited

U.S. PATENT DOCUMENTS

| | | |
|---|---|---|
| 2010/0057067 A1 | 3/2010 | Baust et al. |
| 2010/0076421 A1 | 3/2010 | Baust et al. |
| 2010/0096037 A1 | 4/2010 | Lee et al. |
| 2010/0258290 A1 | 10/2010 | Bass |
| 2011/0056582 A1 | 3/2011 | Walle et al. |
| 2011/0178514 A1 | 7/2011 | Levin et al. |
| 2011/0264084 A1 | 10/2011 | Reid |
| 2012/0085070 A1 | 4/2012 | Chou et al. |
| 2012/0090817 A1 | 4/2012 | Reid |
| 2012/0175007 A1 | 7/2012 | Pan et al. |
| 2012/0184901 A1 | 7/2012 | Nguyen et al. |
| 2012/0228364 A1 | 9/2012 | Vegelahn |
| 2012/0282792 A1 | 11/2012 | Schloegl |
| 2012/0318808 A1 | 12/2012 | McCormick |
| 2013/0105496 A1 | 5/2013 | Jung |
| 2013/0199757 A1 | 8/2013 | Meyer et al. |
| 2014/0008417 A1 | 1/2014 | Visser et al. |
| 2014/0012243 A1 | 1/2014 | Burnett et al. |
| 2014/0090737 A1 | 4/2014 | Reid |
| 2014/0177146 A1 | 6/2014 | Barizza et al. |
| 2014/0182608 A1 | 7/2014 | Egoyants et al. |
| 2014/0275767 A1 | 9/2014 | Baust |
| 2015/0110548 A1 | 4/2015 | Reid |
| 2015/0149800 A1 | 5/2015 | Gendler et al. |
| 2015/0151893 A1 | 6/2015 | Wengreen et al. |
| 2015/0159800 A1 | 6/2015 | Kimura et al. |
| 2015/0168050 A1 | 6/2015 | Cur et al. |
| 2015/0260332 A1 | 9/2015 | Reid |
| 2015/0271927 A1 | 9/2015 | Cocklin et al. |
| 2015/0345930 A1 | 12/2015 | Ikeda et al. |
| 2015/0356730 A1 | 12/2015 | Grove et al. |
| 2016/0044963 A1 | 2/2016 | Saleem |
| 2016/0050784 A1 | 2/2016 | Koizumi et al. |
| 2016/0084425 A1 | 3/2016 | Reid |
| 2016/0279725 A1 | 9/2016 | Azdasht |
| 2016/0314220 A1 | 10/2016 | Sachdev et al. |
| 2016/0317220 A1 | 11/2016 | Guo |
| 2016/0341360 A1 | 11/2016 | Uraguchi et al. |
| 2016/0354853 A1 | 12/2016 | Azdasht |
| 2016/0368072 A1 | 12/2016 | Senga et al. |
| 2017/0043938 A1 | 2/2017 | Reid |
| 2017/0062774 A1 | 3/2017 | Reid et al. |
| 2017/0106414 A1 | 4/2017 | Hamilton |
| 2017/0120362 A1 | 5/2017 | Reid et al. |
| 2017/0165773 A1 | 6/2017 | Azdasht et al. |
| 2017/0225276 A1 | 8/2017 | Reid |
| 2017/0253416 A1 | 9/2017 | Reid |
| 2017/0305641 A1 | 10/2017 | Bodum |
| 2017/0358079 A1 | 12/2017 | Gillies et al. |
| 2018/0106414 A1 | 4/2018 | Reid |
| 2018/0106529 A1 | 4/2018 | Cur et al. |

FOREIGN PATENT DOCUMENTS

| | | |
|---|---|---|
| DE | 4324051 A1 | 1/1995 |
| DE | 10019420 A1 | 10/2001 |
| DE | 202010008131 U1 | 10/2010 |
| EP | 0611614 A1 | 8/1994 |
| EP | 1294022 A2 | 3/2003 |
| EP | 2957804 A1 | 12/2015 |
| FR | 2550313 A1 | 2/1985 |
| GB | 2105226 A | 3/1983 |
| JP | 06-142909 A | 5/1994 |
| JP | 3654249 B2 | 6/2005 |
| JP | 2005-224832 A | 8/2005 |
| JP | 3962782 B1 | 8/2007 |
| JP | 2008-045956 A | 2/2008 |
| WO | 03/25476 A2 | 3/2003 |
| WO | 2009/068255 A1 | 6/2009 |
| WO | 2013/034455 A1 | 3/2013 |
| WO | 2015/091003 A1 | 6/2015 |
| WO | 2017/152045 A1 | 9/2017 |
| WO | 2018/093773 A1 | 5/2018 |
| WO | 2018/093776 A1 | 5/2018 |
| WO | 2018/093781 A1 | 5/2018 |
| WO | 2019/010385 A1 | 1/2019 |
| WO | 2019/014463 A1 | 1/2019 |
| WO | 2019/040885 A1 | 2/2019 |
| WO | 2020/112976 A1 | 6/2020 |

OTHER PUBLICATIONS

Database WPI Week 201179 Thomson Scientific, London, GB; AN 2011-N98729 XP002794699, & CN 202 001 825 U (LINS) Oct. 5, 2011 (Oct. 5, 2011).

https://en.wikipedia.org/wiki/Sodium-sulfur_battery_June 11, 2018, 5 pages.

Overview of NAS Battery for Load Management; CEC Energy Storage Workshop, Feb. 2005, pp. 1-22.

National Research Council, "Assessment of Research Needs for Advanced Battery Systems", 1982, 203 pages.

https://en.wikipedia.org/wiki/Sodium-sulfur battery Jun. 11, 2018, 5 pages.

Hodkinson et al., "Lightweight Electric/Hybrid Vehicle Design", 2001, 4 pages.

Guidotti et al., "Characterization of Vacuum-Multifoil Insulation for Long-Life Thermal Batteries", U.S. Department of Energy, Office of Scientific and Technical Information, Apr. 17, 2000, 3 pages.

Daniel et al., "Handbook of Battery Materials", Wiley-VCH Publishers, 2011, vol. 1, 3 pages.

* cited by examiner

MULTIPLY-INSULATED ASSEMBLIES

CROSS-REFERENCE TO RELATED APPLICATIONS

This application is the National Stage Application of International Patent Application No. PCT/US2017/061529 filed Nov. 14, 2017, which claims the benefit of and priority to U.S. Provisional Patent Application No. 62/422,190, "Multiply-Insulated Assemblies" (filed Nov. 15, 2016), the entireties of which applications are incorporated herein by reference herein for any and all purposes.

TECHNICAL FIELD

The present disclosure relates to the field of vacuum-insulated components.

BACKGROUND

In many fields, there is a need to protect sensitive components (e.g., data recorders, energy storage devices, and the like) from environmental conditions, such as extreme temperatures. Existing insulator components, however, do not provide sufficient insulation to protect their contents from such environmental conditions for sufficiently long periods of time. Accordingly, there is a need in the art for improved insulator components.

SUMMARY

In meeting the described long-felt needs, the present disclosure first provides multiply-insulated articles, comprising:

a first container, the first container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the first container being, at a proximal end of the first container, open to the environment exterior to the first container, the vent of the first container opening in the direction of the proximal end of the first container;

a second container, the second container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the second container being, at a proximal end of the second container, open to the environment exterior to the second container, the vent of the second container opening in the direction of the proximal end of the second container, the second container being disposed within the first container such that the proximal end of the second container is opposite the proximal end of the first container, the first container being disposed within the second container such that the first and second containers define a spacing therebetween; and a spacing material being disposed between the first and second containers so as to maintain the spacing between the first and second containers.

The present disclosure also provides methods, comprising:

with (a) a first container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the first container being, at a proximal end of the first container, open to the environment exterior to the first container, and the vent of the first container opening in the direction of the proximal end of the first container, and (b) a second container, the second container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the second container being, at a proximal end of the second container, open to the environment exterior to the second container, the vent of the second container opening in the direction of the proximal end of the second container, disposing the first container within the second container such that the proximal end of the second container is opposite the proximal end of the first container, disposing the first container within the second container such that the first and second containers define a spacing therebetween; disposing a spacing material between the first and second containers so as to maintain the spacing between the first and second containers; and disposing a conductor so as to place the interior of the first container into electronic communication with the environment exterior to the second container.

Also provided are modules. A module according to the present disclosure suitably comprises a first container having an opening and comprising inner and outer walls and defining a sealed region between the inner and outer walls, the sealed region having a pressure of from about $10^{-5}$ to about $10^{-9}$ Torr, the first container having an opening;

a second container having an opening and comprising inner and outer walls and defining a sealed region between the inner and outer walls, the sealed region having a pressure of from about $10^{-5}$ to about $10^{-9}$ Torr, the second container being disposed within the first container and the second container's opening being disposed opposite the opening of the first container;

the first and second containers defining a space therebetween and enclosing a storage volume within the second container, the space between the first and second containers being occupied by an insulator, the storage volume having disposed within a data recorder, and the data recorder being enclosed in the storage volume within an amount of insulator, within an amount of a phase change material, or both.

BRIEF DESCRIPTION OF THE DRAWINGS

The summary, as well as the following detailed description, is further understood when read in conjunction with the appended drawings. For the purpose of illustrating the invention, there are shown in the drawings exemplary embodiments of the invention; however, the invention is not limited to the specific methods, compositions, and devices disclosed. In addition, the drawings are not necessarily drawn to scale. In the drawings.

DETAILED DESCRIPTION OF ILLUSTRATIVE EMBODIMENTS

Figure 1A:
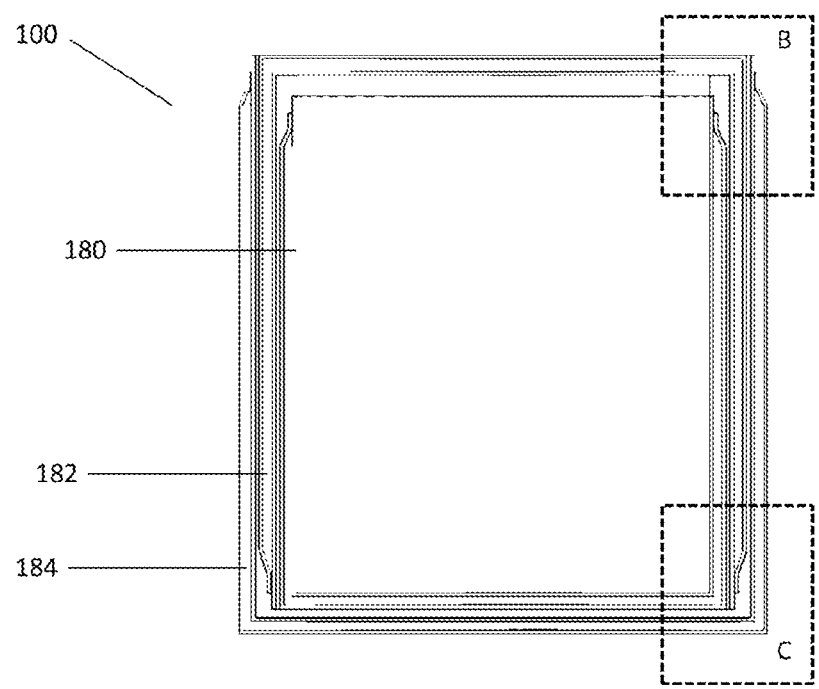
FIG. 1A provides a cutaway view of an exemplary assembly according to the present disclosure.

The present invention may be understood more readily by reference to the following detailed description taken in connection with the accompanying figures and examples, which form a part of this disclosure. It is to be understood that this invention is not limited to the specific devices, methods, applications, conditions or parameters described and/or shown herein, and that the terminology used herein is for the purpose of describing particular embodiments by way of example only and is not intended to be limiting of the claimed invention. Also, as used in the specification including the appended claims, the singular forms "a," "an," and "the" include the plural, and reference to a particular numerical value includes at least that particular value, unless the context clearly dictates otherwise. The term "plurality", as used herein, means more than one. When a range of values is expressed, another embodiment includes from the one particular value and/or to the other particular value.

As used in the specification and in the claims, the term "comprising" may include the embodiments "consisting of" and "consisting essentially of" The terms "comprise(s)," "include(s)," "having," "has," "can," "contain(s)," and variants thereof, as used herein, are intended to be open-ended transitional phrases, terms, or words that require the presence of the named ingredients/steps and permit the presence of other ingredients/steps. However, such description should be construed as also describing compositions or processes as "consisting of" and "consisting essentially of" the enumerated ingredients/steps, which allows the presence of only the named ingredients/steps, along with any impurities that might result therefrom, and excludes other ingredients/steps.

Similarly, when values are expressed as approximations, by use of the antecedent "about," it will be understood that the particular value forms another embodiment.

As used herein, the terms "about" and "at or about" mean that the amount or value in question can be the value designated some other value approximately or about the same. It is generally understood, as used herein, that it is the nominal value indicated ±10% variation unless otherwise indicated or inferred. The term is intended to convey that similar values promote equivalent results or effects recited in the claims. That is, it is understood that amounts, sizes, formulations, parameters, and other quantities and characteristics are not and need not be exact, but can be approximate and/or larger or smaller, as desired, reflecting tolerances, conversion factors, rounding off, measurement error and the like, and other factors known to those of skill in the art. In general, an amount, size, formulation, parameter or other quantity or characteristic is "about" or "approximate" whether or not expressly stated to be such. It is understood that where "about" is used before a quantitative value, the parameter also includes the specific quantitative value itself, unless specifically stated otherwise.

Numerical values in the specification and claims of this application reflect average values for a composition that may contain individual polymers of different characteristics. Furthermore, unless indicated to the contrary, the numerical values should be understood to include numerical values which are the same when reduced to the same number of significant figures and numerical values which differ from the stated value by less than the experimental error of conventional measurement technique of the type described in the present application to determine the value.

All ranges disclosed herein are inclusive of the recited endpoint and independently combinable (for example, the range of "from 2 grams to 10 grams" is inclusive of the endpoints, 2 grams and 10 grams, and all the intermediate values). The endpoints of the ranges and any values disclosed herein are not limited to the precise range or value; they are sufficiently imprecise to include values approximating these ranges and/or values.

As used herein, approximating language may be applied to modify any quantitative representation that may vary without resulting in a change in the basic function to which it is related. Accordingly, a value modified by a term or terms, such as "about" and "substantially," may not be limited to the precise value specified, in some cases. In at least some instances, the approximating language may correspond to the precision of an instrument for measuring the value.

The modifier "about" should also be considered as disclosing the range defined by the absolute values of the two endpoints. For example, the expression "from about 2 to about 4" also discloses the range "from 2 to 4." The term "about" may refer to plus or minus 10% of the indicated number. For example, "about 10%" may indicate a range of 9% to 11%, and "about 1" may mean from 0.9-1.1. Other meanings of "about" may be apparent from the context, such as rounding off, so, for example "about 1" may also mean from 0.5 to 1.4.

All ranges are inclusive and combinable, and it should be understood that steps may be performed in any order.

It is to be appreciated that certain features of the invention which are, for clarity, described herein in the context of separate embodiments, may also be provided in combination in a single embodiment. Conversely, various features of the invention that are, for brevity, described in the context of a single embodiment, may also be provided separately or in any subcombination. Further, reference to values stated in ranges include each and every value within that range.

In one aspect, the present disclosure provides multiply-insulated articles. An article may comprise a first container, the first container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space.

As explained in U.S. Pat. Nos. 7,681,299 and 7,374,063 (incorporated herein by reference in their entireties for any and all purposes), the geometry of an insulating space may be such that it guides gas molecules within the space toward a vent or other exit from the space. The width of the vacuum insulating space need not be not uniform throughout the length of the space. The space may include an angled portion such that one surface that defines the space converges toward another surface that defines the space. As a result, the distance separating the surfaces may vary adjacent the vent such the distance is at a minimum adjacent the location at which the vent communicates with the vacuum space. The interaction between gas molecules and the variable-distance portion during conditions of low molecule concentration serves to direct the gas molecules toward the vent.

The molecule-guiding geometry of the space provides for a deeper vacuum to be sealed within the space than that which is imposed on the exterior of the structure to evacuate the space. This somewhat counterintuitive result of deeper vacuum within the space is achieved because the geometry of the present invention significantly increases the probability that a gas molecule will leave the space rather than enter. In effect, the geometry of the insulating space functions like a check valve to facilitate free passage of gas molecules in one direction (via the exit pathway defined by vent) while blocking passage in the opposite direction.

Another benefit associated with the deeper vacuums provided by the geometry of insulating space is that it is achievable without the need for a getter material within the evacuated space. The ability to develop such deep vacuums without a getter material provides for deeper vacuums in devices of miniature scale and devices having insulating spaces of narrow width where space constraints would limit the use of a getter material.

Other vacuum-enhancing features may also be included, such as low-emissivity coatings on the surfaces that define the vacuum space. The reflective surfaces of such coatings, generally known in the art, tend to reflect heat-transferring rays of radiant energy. Limiting passage of the radiant energy through the coated surface enhances the insulating effect of the vacuum space.

In some embodiments, an article may comprise first and second walls spaced at a distance to define an insulating space therebetween and a vent communicating with the insulating space to provide an exit pathway for gas molecules from the insulating space. The vent is sealable for maintaining a vacuum within the insulating space following evacuation of gas molecules through the vent. The distance between the first and second walls is variable in a portion of the insulating space adjacent the vent such that gas molecules within the insulating space are directed towards the vent during evacuation of the insulating space. The direction of the gas molecules towards the vent imparts to the gas molecules a greater probability of egress than ingress with respect to the insulating space, thereby providing a deeper vacuum without requiring a getter material in the insulating space.

The construction of structures having gas molecule guiding geometry according to the present invention is not limited to any particular category of materials. Suitable materials for forming structures incorporating insulating spaces according to the present invention include, for example, metals, ceramics, metalloids, or combinations thereof.

The convergence of the space provides guidance of molecules in the following manner. When the gas molecule concentration becomes sufficiently low during evacuation of the space such that structure geometry becomes a first order effect, the converging walls of the variable distance portion of the space channel gas molecules in the space toward the vent. The geometry of the converging wall portion of the vacuum space functions like a check valve or diode because the probability that a gas molecule will leave the space, rather than enter, is greatly increased.

The effect that the molecule-guiding geometry of structure has on the relative probabilities of molecule egress versus entry may be understood by analogizing the converging-wall portion of the vacuum space to a funnel that is confronting a flow of particles. Depending on the orientation of the funnel with respect to the particle flow, the number of particles passing through the funnel would vary greatly. It is clear that a greater number of particles will pass through the funnel when the funnel is oriented such that the particle flow first contacts the converging surfaces of the funnel inlet rather than the funnel outlet.

Various examples of devices incorporating a converging wall exit geometry for an insulating space to guide gas particles from the space like a funnel are provided herein. It should be understood that the gas guiding geometry of the invention is not limited to a converging-wall funneling construction and may, instead, utilize other forms of gas molecule guiding geometries. Some exemplary vacuum-insulated spaces (and related techniques for forming and using such spaces) may be found in United States published patent applications 2017/0253416; 2017/0225276; 2017/0120362; 2017/0062774; 2017/0043938; 2016/0084425; 2015/0260332; 2015/0110548; 2014/0090737; 2012/0090817; 2011/0264084; 2008/0121642; and 2005/0211711, all by A. Reid, and all incorporated herein by reference in their entireties for any and all purposes.

It should be understood that a vacuum (i.e., any vacuum within the disclosed devices and methods) may be effected by the methods in the aforementioned applications or by other methods known in the art. The vacuum (or reduced pressure) within an article according to the present disclosure may be in the range of from, e.g., $10^{-5}$ to $10^{-9}$ Torr, e.g., $10^{-5}$, $10^{-6}$, $10^{-7}$, $10^{-8}$, or even $10^{-9}$ Torr and all intermediate values.

The interior volume of the first container may, at a proximal end of the first container, be open to the environment exterior to the first container. As one example, a first container may be cylindrical in configuration, with one open (proximal) end and one closed (distal) end. The vent of the first container may open in the direction of the proximal end of the first container, though this is not required.

An article may comprise a second container. A second container suitably comprises a first wall enclosing an interior volume; a second wall enclosing the first wall and the second wall being spaced at a distance from the first wall to define an insulating space therebetween. The second container may comprise a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space.

The second container may be, e.g., cylindrical. In some exemplary embodiments, both the first and second containers are cylindrical, and the first container is disposed within the second container. A container may be a straight wall container, but a container's walls may be curved, kinked, or otherwise non-linear.

The interior volume of the second container may be, at a proximal end of the second container, open to the environment exterior to the second container. The vent of the second container may open in direction of the proximal end of the second container, though this is not a requirement.

The second container may be disposed within the first container such that the proximal end of the second container is opposite the proximal end of the first container. The first container may be disposed within the second container such that the first and second containers define a spacing therebetween. A spacing material may be disposed between the first and second containers so as to maintain the spacing between the first and second containers.

Figure 1B:
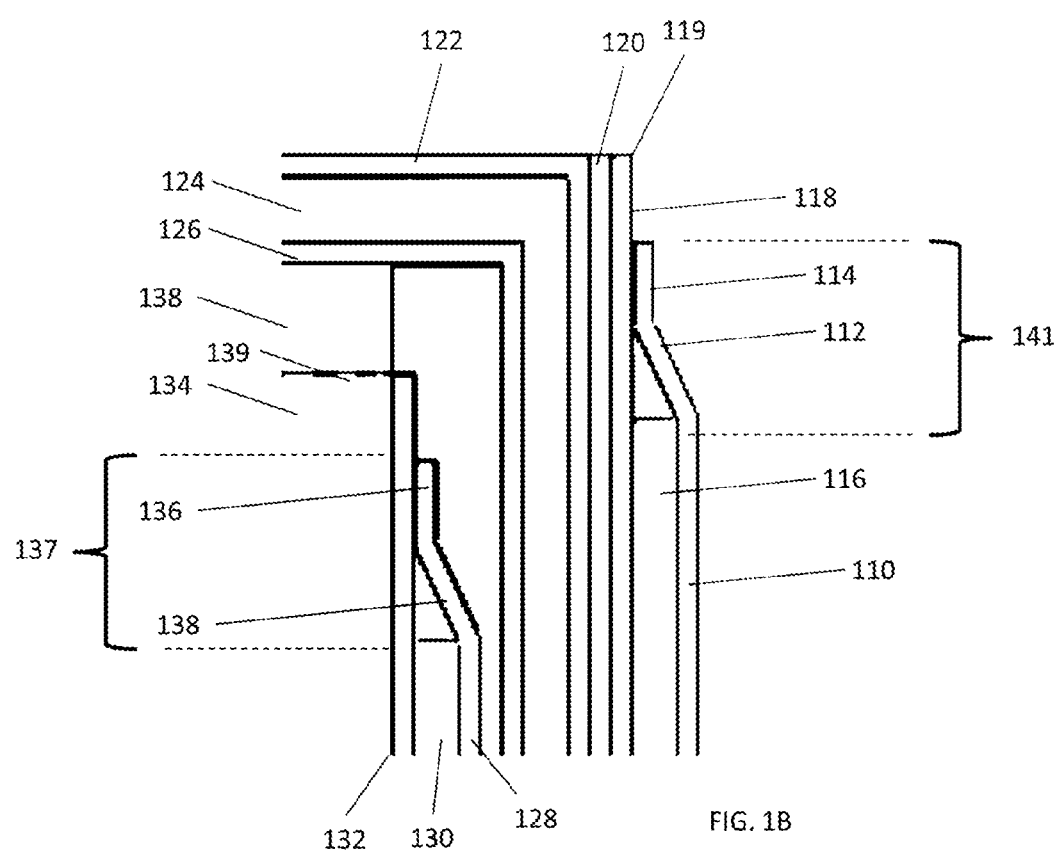
FIG. 1B provides a close-up view of the area designated as "B" in FIG. 1A.
Figure 1C:
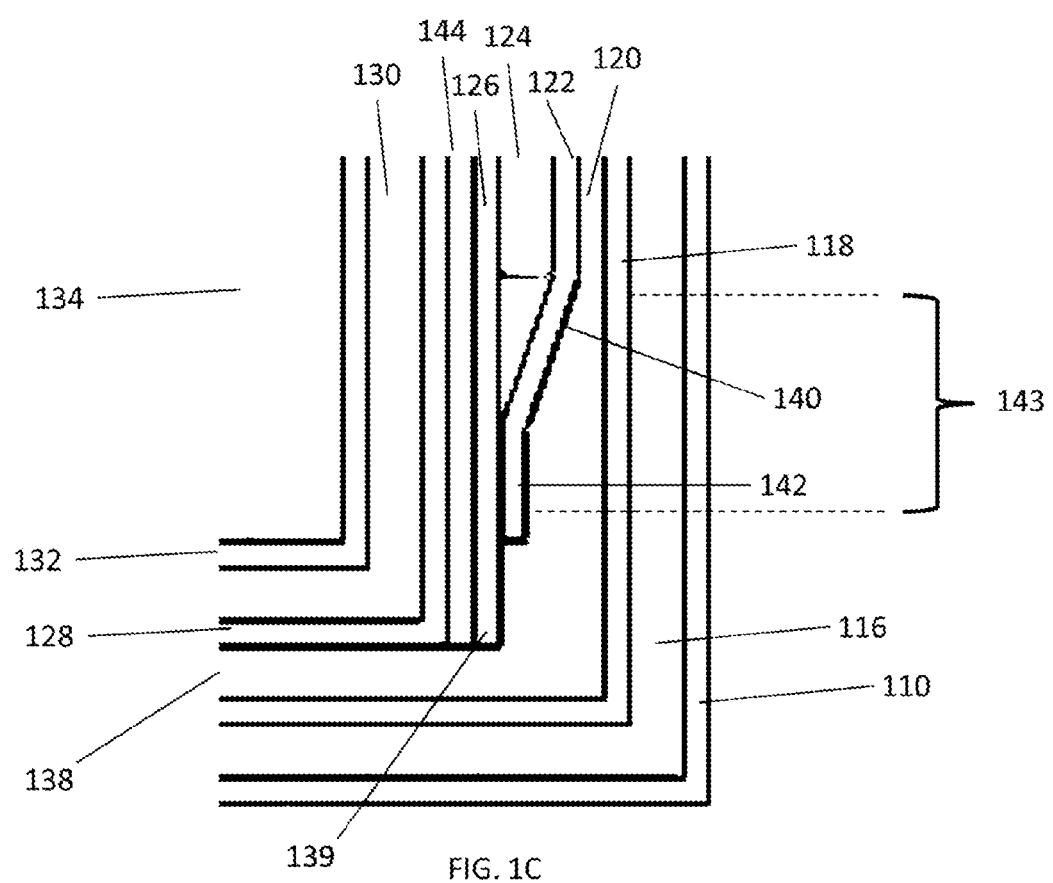
FIG. 1C provides a close-up view of the area designated as "C" in FIG. 1A.

In one exemplary embodiment, a cylindrical first container having an open proximal end and a closed distal end may be disposed within a second container having an open proximal end and a closed distal end. In one embodiment, the first and second container are nested such that the first container is within the second container such that the open end of the second container is closer to the closed end of the first container. Put another way, an open-ended first container may be disposed within an open-ended second container such that the first container opens in a direction opposite to the direction in which the second container opens. One such exemplary embodiment is shown in FIGS. 1A-1C, described elsewhere herein.

An article according to the present disclosure may comprise a third container. The third container may comprise a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space.

The interior volume of the third container may be, at a proximal end of the second container, open to the environment exterior to the third container. The third container may be disposed with the second container such that the proximal end of the third container is opposite the proximal end of the second container.

The second container may be disposed within the third container such that the second and third containers define a spacing therebetween. A spacing material (which may be an insulating material) may be disposed between the second and third containers so as to maintain the spacing between the first and third containers.

A spacing material may comprise, e.g., epoxy, a silicone, a ceramic, a polymer, or any combination thereof. A spacing material may be an insulating material, and may be fibrous or even porous in nature.

An article may include a conductor disposed so as to place the interior volume of the first container into electronic communication with the environment exterior to the second container. In some embodiments, at least a portion of the conductor is disposed within the spacing between the first and second containers.

In some embodiments, an article may include a conductor disposed so as to place the interior volume of the first container into electronic communication with the environment exterior to the third container. It some embodiments, a single conductor runs from the environment exterior to the article, between the first and second containers, and into the interior volume of the first container. In some embodiments, a single conductor runs from the environment exterior to the article, between the third and second containers, between the second and first containers, and into the interior volume of the first container. The conductor and the conductor's pathway may be of such a length so as to provide only a minimal pathway for thermal transport.

A conductor may be an electrical conductor, e.g., a wire. The conductor may be optically, thermally, or electrically insulated.

An article according to the present disclosure may include a device disposed within the article, e.g., within the interior volume of the first container.

In some embodiments, the interior volume of the first container may be sealed against the environment exterior to the article. This may be effected by a spacing material disposed between the first and second containers; suitable spacing materials are described elsewhere herein. In embodiments where a conductor or other conduit may extend into the interior volume of the first container, a sealing material may be disposed so as to seal the entry of the conductor into the interior volume of the first container.

Similarly, the interior volume of the second container may be sealed against the environment exterior to the article. Likewise, the interior volume of the third container may sealed against the environment exterior to the article.

An article may, in some embodiments, comprise a heat sink material or phase change material. Such a material may act to ameliorate or dampen temperature changes within the article.

Articles according to the present disclosure may comprise an inner container disposed within the interior volume of a container, e.g., the first container. Such an inner container may comprise a chemically non-reactive material, e.g., PTFE or other chemically inert material. This inner container may serve to enclose a device (e.g., a data recorder) that is disposed within the first container.

A container (e.g., the first or innermost container) may also comprise within, e.g., further insulation (e.g., a foam, a fiber, and the like). A container (e.g., a first or innermost container) may also comprise a lining (e.g., polyethylene) within the container's inner volume.

The present disclosure also provides methods, which methods may be applied to construct multiply-insulated articles.

Methods according to the present disclosure may comprise:

(a) a first container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the first container being, at a proximal end of the first container, open to the environment exterior to the first container, the vent of the first container opening in the direction of the proximal end of the first container, and (b) a second container, the second container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the second container being, at a proximal end of the second container, open to the environment exterior to the second container, and the vent of the second container opening in the direction of the proximal end of the second container, disposing the first container within the second container such that the proximal end of the second container is opposite the proximal end of the first container. The disposition may be accomplished manually or in an automated fashion. The first container may be disposed within the second container such that the first and second containers define a spacing therebetween.

The methods may also include disposing a spacing material between the first and second containers so as to maintain the spacing between the first and second containers. Suitable spacing materials are described elsewhere herein. A spacing material may be disposed via spraying, extrusion, CVD, powder coating, dripping, coating, brushing, or by other methods known to those of ordinary skill in the art.

In some embodiments, the methods may further comprise disposing a conductor so as to place the interior of the first container into electronic communication with the environment exterior to the second container. Suitable conductors are described elsewhere herein and include, e.g., electronic conductors (e.g., wires), optical conductors, and the like.

The disclosed methods may further comprise sealing the interior of the first container against the environment exterior to the first container. Similarly, the methods may include sealing the interior of the second container against the environment exterior to the second container.

The disclosed methods may further comprise disposing a third container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the third container being, at a proximal end of the second container, open to the environment exterior to the third container.

The disposing may be effected such that the third container is disposed with the second container such that the proximal end of the third container is opposite the proximal end of the second container. The disposing may be effected such that the second container being disposed within the third container such that the second and third containers define a spacing therebetween.

The methods may also include disposing a spacing material being disposed between the second and third containers so as to maintain the spacing between the second and third containers.

A user may dispose a conductor such that the conductor places the interior of the first container into electronic communication with the environment exterior to the third container.

Also provide are modules, comprising: a first container having an opening and comprising inner and outer walls and defining a sealed region between the inner and outer walls, the sealed region having a pressure of from about $10^{-5}$ to about $10^{-9}$ Torr, e.g., $10^{-6}$, $10^{-7}$, or $10^{-8}$ Torr. The sealed region may be according to any of United States published patent applications 2015/0110548, 2014/0090737, 2012/0090817, 2011/0264084, 2008/0121642, and 2005/0211711.

The first container suitably has an opening. Such a container may be can-like in configuration or otherwise open at one end, e.g., an open-ended can or other vessel. The container may be straight-walled (e.g., a can), but may also be tapered or even curved.

The modules suitably also include a second container. A second container may suitably have an opening and comprises inner and outer walls, the walls defining therebetween a sealed region between the inner and outer walls, the sealed region having a pressure of from about $10^{-5}$ to about $10^{-9}$ Torr, (Suitable sealed regions are described elsewhere herein.)

Figure 3A:
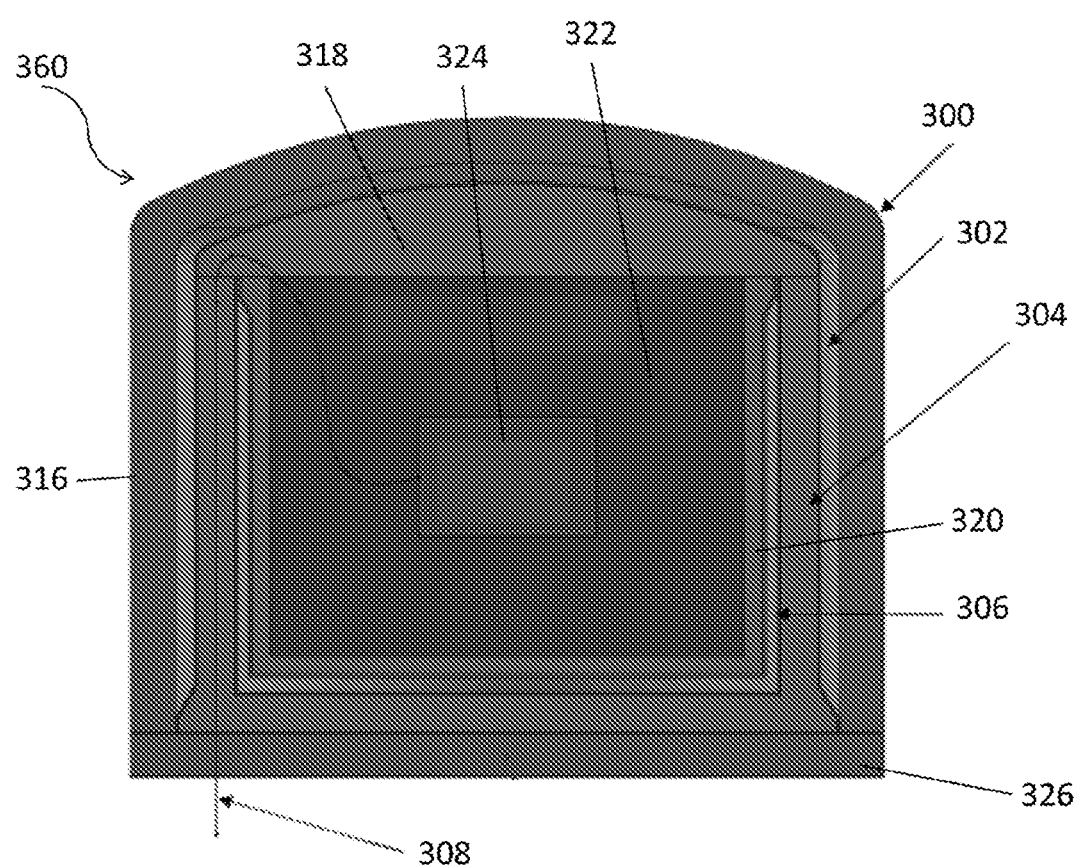
FIG. 3A provides a cutaway view of a container according to the present disclosure.

The second container may be disposed within the first container and the second container's opening being disposed opposite the opening of the first container. One such example is shown in FIG. 3A, where vacuum layer 302 acts as the first container and vacuum layer 306 acts as the second container.

The second container may be configured as an open-ended can or other vessel. The walls of the container may be straight, but may also be tapered or even curved.

The first and second containers suitably define a space therebetween. The space acts to enclose a storage volume within the second container. The space between the first and second containers may be occupied by an insulator. (Suitable insulators are described elsewhere herein.)

The storage volume of the modules may have a device disposed within, e.g., a data recorder. The device is suitably enclosed in the storage volume within an amount of insulator, within an amount of a phase change material, or both. In this way, the module acts to enclose the device and protect the device from the mechanical and thermal stresses that may originate from outside the device.

The module may further comprise a container (also referred to as an outer container) that sealably encloses the first and second containers. The container may be an enclosure or outer wall.

Figure 3B:
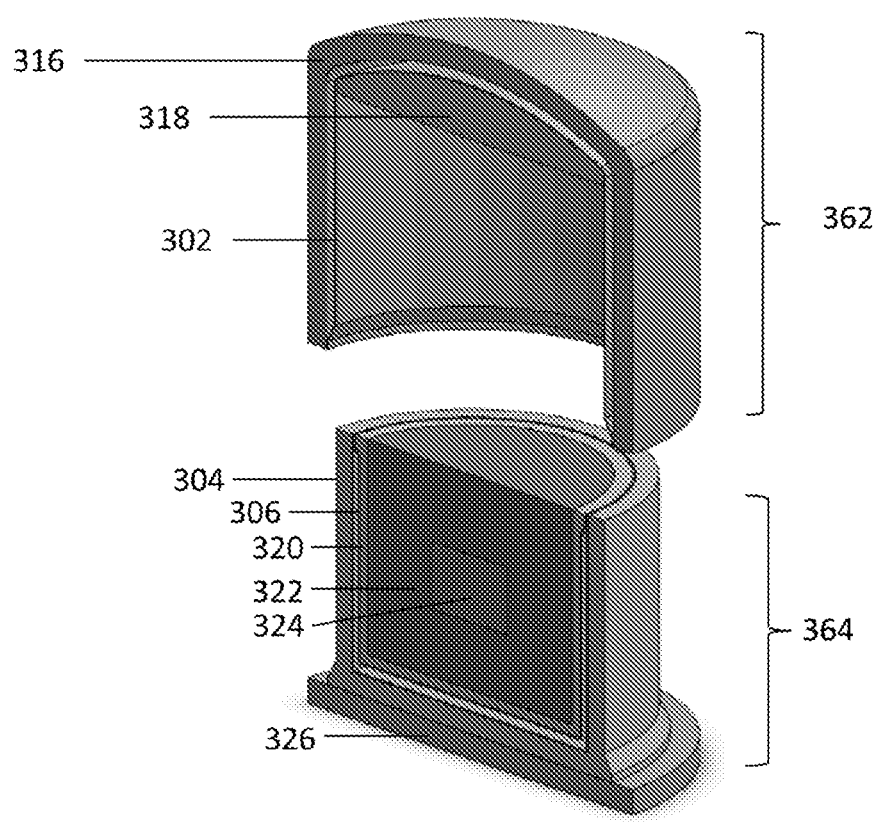
FIG. 3B provides an exploded cutaway view of the container of FIG. 3A.

The outer container may be separable into at least first and second parts. As one example, FIG. 3B illustrates an outer container that is separable into upper and lower portions, as described elsewhere herein. The parts may be secured to one another by latches, adhesive, screw fittings, and the like.

EXEMPLARY EMBODIMENTS

FIGS. 1A, 1B, and 1C provide an exemplary embodiment of the disclosed technology. FIG. 1A provides a cutaway view of an exemplary insulated article 100. The article comprises, inter alia, first container 180 and second container 182, with first container 180 disposed within second container 182. In this exemplary embodiment, second container 182 is, in turn, disposed within third container 184.

FIG. 1B provides a closer view of the area designated "B" in FIG. 1A. As shown in FIG. 1B, the first container comprises inner wall 132 and outer wall 128. Outer wall 128 has a tapered portion 128 and a flat portion 136, which flat portion 136 engaged with inner wall 132 of the first container. The tapered portion 128 of the second wall forms a vent 137 that is in communication with the insulating space 130 between first wall 132 and second wall 128. Vent 137 may communicate with the insulating space 130 to provide an exit pathway for gas molecules from the space. The vent may be being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space.

The first container also defines interior volume 134. As shown in FIG. 1B, vent 137 may open in the direction of proximal end 139 of the first container.

In the embodiment shown in FIG. 1B, the second container comprises inner wall 126 and outer wall 122. Space 138 is disposed between the inner wall 126 of the second container and walls 132 and 128 of the first container. Insulating space 124 is disposed between inner wall 126 and outer wall 122 of the second container. A vent (described in FIG. 1C) seals insulating space 124.

The third container comprises inner wall 118 and outer wall 110; insulating space 116 is disposed therebetween. Outer wall 110 may include a tapered portion 112 and a flat portion 114, which flat portion may engage with inner wall 118. The tapered portion 112 of the second wall forms a vent 141 that is in communication with the insulating space 116 between walls 118 and 110 of the third container.

Vent 141 may communicate with the insulating space 116 to provide an exit pathway for gas molecules from the space, the vent being sealable for maintaining a vacuum within the insulating space following evacuation of gas molecules through the vent, the distance between the inner and outer walls being variable in a portion of the insulating space adjacent the vent such that gas molecules within the insulating space are directed towards the vent by the variable-distance portion of the first and second walls during the evacuation of the insulating space. Vent 141 may, in some embodiments, open in the direction of the proximal end 119 of the third container.

FIG. 1C provides a closer view of the area designated "C" in FIG. 1A. As shown in exemplary FIG. 1C, a first container comprises inner wall 132 and outer wall 128, which walls define insulated space 130 therebetween. The first container also defines interior volume 134. Proximal end 139 of the first container may be at least partially open to the environment exterior to the first container. The distal end of the first container (not labeled) may be closed, e.g., the bottom of a can.

Second container comprises inner wall 126 and outer wall 122. Outer wall 122 may include a tapered region 140 and a flat region 142, which flat region may engage with inner wall 126. Insulated space 124 is defined between the inner and outer walls. Vent 143 may communicate with the insulating space 124 to provide an exit pathway for gas molecules from the space, the vent being sealable for maintaining a vacuum within the insulating space following evacuation of gas molecules through the vent, the distance between the inner and outer walls being variable in a portion of the insulating space adjacent the vent such that gas molecules within the insulating space are directed towards the vent by the variable-distance portion of the walls during the evacuation of the insulating space.

A third container comprises inner wall 118 and outer wall 110. Space 120 is defined between the second and third containers; space 144 is defined between the first and second containers. A space may be filled with an insulating material (e.g., a polymer, a silicone, and the like).

Figure 2A:
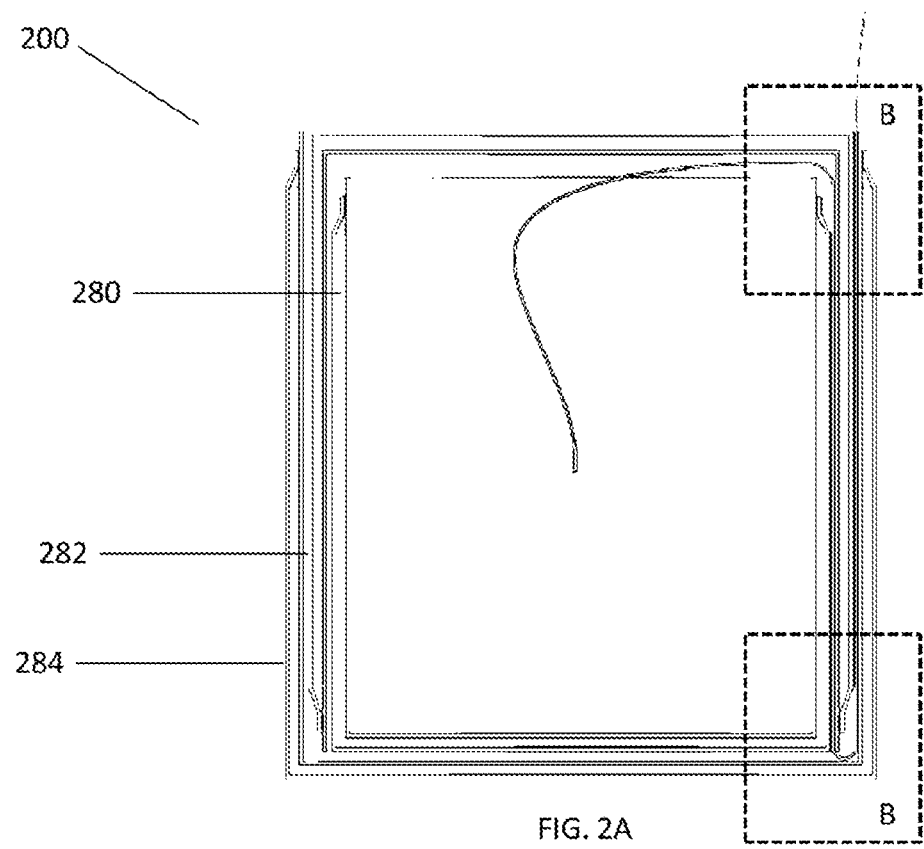
FIG. 2A provides a cutaway view of a further exemplary assembly according to the present disclosure.
Figure 2B:
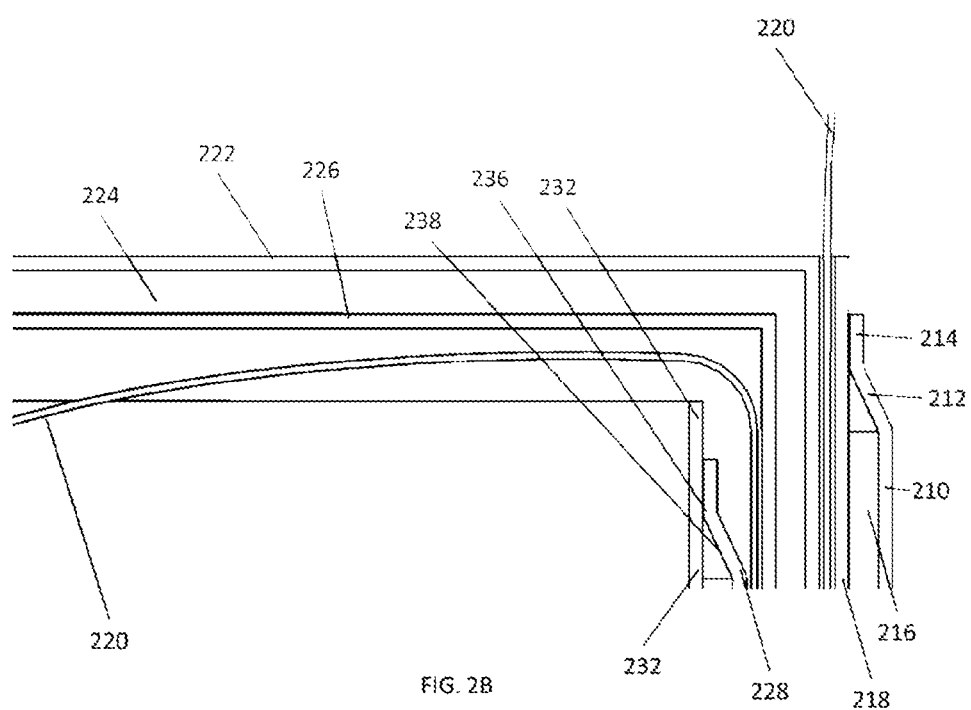
FIG. 2B provides a close-up view of the area designated as "B" in FIG. 2A.
Figure 2C:
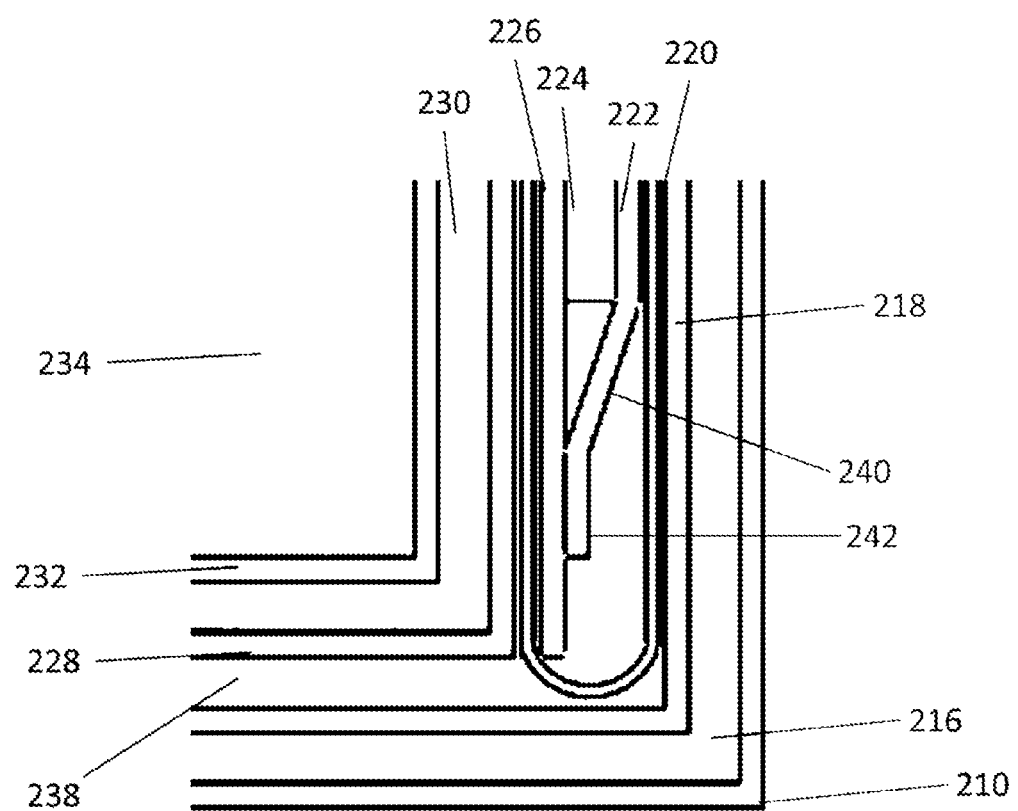
FIG. 2C provides a close-up view of the area designated as "C" in FIG. 2A.

FIGS. 2A, 2B, and 2C provide an exemplary embodiment of the disclosed technology. FIG. 2A provides a cutaway view of an insulated article 200. The article comprises, inter alia, first container 282 and second container 280 disposed within first container 282. Second container 282 is disposed within third container 284.

FIG. 2B provides a closer view of the area designated "B" in FIG. 2A. As shown in FIG. 2B, the first container is comprised on inner wall 232 and outer wall 228. Outer wall 228 has a tapered portion 228 and a flat portion 236, which flat portion 236 engaged with inner wall 232 of the first container. The tapered portion 228 of the second wall forms a vent that is in communication with the insulating space (not labeled) between first wall 232 and second wall 228. The vent may communicate with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space. The first container also defines interior space (not labeled), into which interior space conductor 220 extends.

The second container is comprised of inner wall 232 and outer wall 228. Space 238 is disposed between the inner wall 226 of the second container and the walls 232 and 228 of the first container. Insulating space 224 is disposed between inner wall 226 and outer wall 222 of the second container.

The third container comprises inner wall 228 and outer wall 210; insulating space 216 is disposed therebetween. Outer wall 210 may include a tapered portion 212 and a flat portion 214, which flat portion may engage with inner wall 218. The tapered portion 212 of the second wall forms a vent that is in communication with the insulating space 216 between walls 218 and 210. The vent may communicate with the insulating space 216 to provide an exit pathway for gas molecules from the space, the vent being sealable for maintaining a vacuum within the insulating space following evacuation of gas molecules through the vent, the distance between the inner and outer walls being variable in a portion of the insulating space adjacent the vent such that gas molecules within the insulating space are directed towards the vent by the variable-distance portion of the first and second walls during the evacuation of the insulating space.

FIG. 2C provides a closer view of the area designated "C" in FIG. 2A. As shown in FIG. 2C, a first container comprises inner wall 232 and outer wall 228, which walls define insulated space 230 therebetween. The first container also defines interior volume 234.

A second container comprises inner wall 226 and outer wall 222. Outer wall 222 may include a tapered region 240 and a flat region 242, which flat region may engage with inner wall 226. Insulated space 224 is defined between the inner and outer walls. The vent may communicate with the insulating space 224 to provide an exit pathway for gas molecules from the space, the vent being sealable for maintaining a vacuum within the insulating space following evacuation of gas molecules through the vent, the distance between the inner and outer walls being variable in a portion of the insulating space adjacent the vent such that gas molecules within the insulating space are directed towards the vent by the variable-distance portion of the walls during the evacuation of the insulating space.

A third container comprises inner wall 218 and outer wall 210. Space 220/238 is defined between the second and third containers; space 244 is defined between the first and second containers. A space may be filled with an insulating material (e.g., a polymer, a silicone, and the like). As shown in FIGS. 2A-2C, conductor 220 may extend from the interior volume of the first container through a space between the first and second containers, through a space between the second and third containers, and out to the environment exterior to the assembly. As described elsewhere herein, the conductor may be a wire (e.g., an insulated wire). It should be understood that a conductor conducts a signal (e.g., electricity, an optical signal). A conductor may comprise a metal, a fiber optic, and the like. In some embodiments, a conductor may be tubular or even a ribbon in configuration. The conductor may, in some embodiments, be configured to act as an antenna or transmitter.

As shown in the figures, a conductor may place a device (not shown) that is disposed within the first container into communication (e.g., electronic, optical) with the environment exterior to the assembly. In this way, the disclosed assemblies afford protection to devices disposed within while also allowing a user to interface with the device disposed within the assembly. As one example, an assembly may comprise within an accelerometer or GPS device, which device is in turn protected from the exterior environment, e.g., as a so-called "black box" for an aircraft.

FIGS. 3A and 3B provide cutaway views of a container according to the present disclosure. Such containers may be used as containers for flight data recorders or in other high-performance applications.

FIG. 3A provides a cutaway view of container 360. As shown in the FIG., container 360 may include mechanical protection 300. Mechanical protection 300 may comprise one or more walls (e.g., metal, plastic, ceramic, and the like), including outer wall 316. The mechanical protection 300 may include a layer of resilient material—such as a rubber/elastomer—to provide absorbance of impact forces on container 360. A vacuum region 302 may be present; the vacuum region is suitably formed defined between two sealed walls. (Suitable vacuum regions and methods of forming such regions are described elsewhere herein.) The vacuum region may be brazed, welded, or otherwise attached to mechanical protection 300.

The container may also comprise additional vacuum region 306. The additional vacuum region may be suitably defined between two sealed walls; suitable vacuum regions and methods of forming such regions are described elsewhere herein.

In some embodiments—including exemplary, non-limiting FIG. 3A, a vacuum region may be configured as an open-ended can, e.g., vacuum region 302. In this way, a container may be assembled such that one can-shaped vacuum region is disposed inside another, whereby the openings of the two can-shaped vacuum regions are opposite one another, as shown in FIG. 3A. The assembly of the two can-shaped containers in turn defines a spacing between the two cans, which spacing may in turn be filled by insulation material. The spacing also allows for passage of a lead (item 308 in FIG. 3A) or other element so as to allow for communication between the interior of the container and the environment exterior to the container.

A container may also include insulation 304. The insulation may be a foam, a fibrous material, a porous material, or any combination thereof. Insulation may be disposed within the container/article, but may also be disposed on the exterior of the article as well. The insulation may comprise a portion 318 that is domed or otherwise shaped to fit within the container 360. It should be understood that the insulation of the disclosed containers may be in multiple pieces, which pieces may be assembled together so as to fill an internal volume or volumes of container 360. As one example, in the case of a container that has a cylindrical, domed volume within as shown in FIG. 3A, the insulation may be in a domed portion and a cylindrical portion. The domed portion and cylindrical portion may be formed of a single piece of insulation, but may also be assembled together, e.g., via adhesive, ultrasonic welding, and the like.

The insulation may be rigid (e.g., a ceramic), but may also be flexible or even compressible. Additional insulation 320 may also be present in the container. As shown in FIG. 3A, insulation 304 and additional insulation 320 may be disposed on either side of additional vacuum region 306.

A container may include base 326. Base 326 may be formed according to mechanical protection 300; i.e., it may have the same wall configuration as mechanical protection 300. Mechanical protection 330 may include insulation (interior and/or exterior), as may base 326.

Container 360 may have disposed within it device 324. Device 324 may be a data module (e.g., a flight data recorder, a temperature recorder, a pH meter, a humidity recorder, an accelerometer, and the like). The device may also be connected to or be in communication with lead 308.

Lead 308 may be a wire, a fiber optic, or any combination thereof. Lead 308 may carry a signal to/from the device 324.

A container according to the present disclosure may also include a heat absorbing material 322. The heat absorbing material may be a phase change material, e.g., a wax, a gel, and the like. There may be a layer (e.g., a moisture-proof layer) that separates device 324 from heat absorbing material 322. Likewise, there may be a layer (e.g., a moisture-proof layer) that separates the heat absorbing material 322 from additional insulation.

An exploded view of container 360 is provided in FIG. 3B. As shown in FIG. 3B, container 360 may be separated into upper part 362 and lower part 364. Upper part 362 may comprise mechanical reinforcement 330 (not labeled), which mechanical reinforcement may include an outer surface 316. Upper portion 362 may include an amount of insulation 318, which amount of insulation may be secured to the upper portion, e.g., via adhesive or other attachment.

Upper portion 362 may also include vacuum region 302. In some embodiments, the vacuum region may be integral with the upper portion. In some embodiments, the vacuum region may be formed separately from the upper portion and then attached to the upper portion, e.g., via brazing, adhesive, or by other methods.

A container according to the present disclosure may also comprise lower portion 364. Lower portion 364 may include insulation 304 and additional insulation 320; suitable insulation is described elsewhere herein. The lower portion may also include a vacuum region 306 as shown, as well as heat absorbing material 322. The lower portion of a container may also comprise base 326.

It should be understood that vacuum regions are not limited to the vacuum regions shown in FIG. 3A. As one example, mechanical reinforcement 330 may comprise a vacuum region within. Similarly, base 326 may comprise a vacuum region formed within. A container may be configured such that a straight-line path from a location exterior to the container to the interior of the container may pass through at least one vacuum region.

It should be understood that containers according to the present disclosure may be configured to provide mechanical, thermal, and moisture protection for a device (e.g., a flight data recorder) disposed within the container. Mechanical reinforcement 330 (which may be a metal wall or walls) provide impact and other protection for the contents of the container. The vacuum region or vacuum regions of the container provide thermal insulation for the device disposed within the container. Similarly, the insulation and heat absorbing material also provide thermal protection for the contents of the container.

Figure 4:
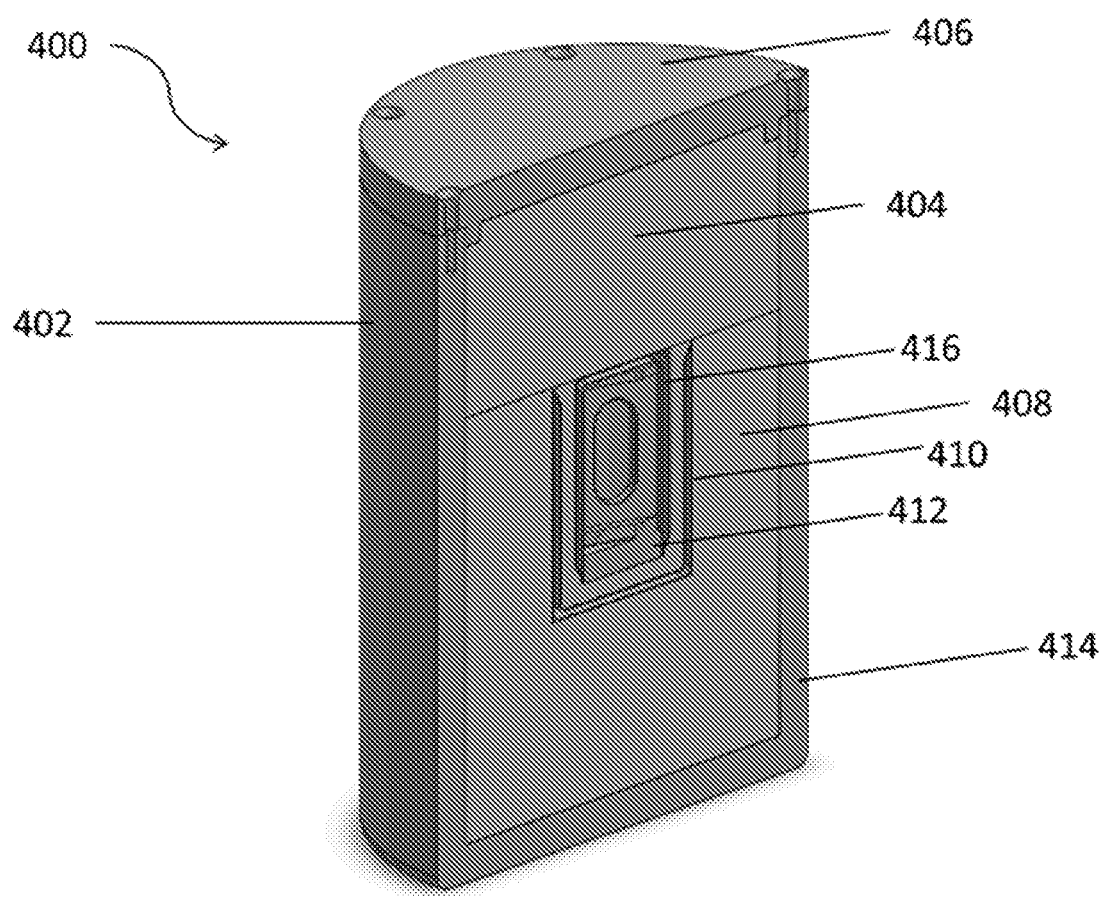
FIG. 4 provides a cutaway view of an alternative container according to the present disclosure.

A further illustrative article 400 is provided in FIG. 4. As shown in that figure, mechanical protection 402 (e.g., an outer container or shell) may enclose contents. Article 400 may comprise a lid or upper cover 406 and a lower portion 414. The mechanical protection 402 and lid 406 (and lower portion 414) may be formed of metal, ceramic, plastic, and the like, and may be single- or multi-walled. The interior of article may include an amount of material 404. Material 404 may be heat-absorbing (e.g., a phase-change material). Material 404 may also be an insulating material, e.g., a microporous or other insulation material. Such a material may be ceramic, polymeric, or even metallic in nature. The material 404 may be present in two parts; upper portion 404 and lower portion 408. The upper and lower portions may be of the same or different materials and may be bound to one another, although this is not a requirement.

Article 400 may also enclose a device 412, e.g., a monitor, data recorder, and the like. Device 412 may be enclosed within one or more vacuum-insulated vessels, e.g., inner vessel 416 and outer vessel 410. Inner vessel 416 and outer vessel 410 may be can-shaped in configuration and one of the inner and outer vessels may be inverted relative to the other. It should be understood that an article may comprise an insulating material disposed therein, a heat-absorbing material disposed therein, or both.

Microporous insulation may be, e.g., made by compacting silica or alumina particles/fibers. The particles/fibers in such insulation may have a cross-sectional dimension (diameter, length, and the like) in the range of from about 5 to about 25 nm. A microporous insulation may, by volume, comprise form about 70 to about 90% air, which air is normally contained within minute pores between particles. The pore size in a microporous insulation may be such that the majority of the pores have a size comparable to or below the mean free path of air molecules at standard atmospheric pressure, which is about 70 nm. A microporous (or other) insulation used in the disclosed technology may have a W/m*K value (measured at about 200 deg C.) of from about 0.002 to about 0.010 or even to about 0.1.

The following is a table of thermal conductivity (as a function of temperature) for one example, non-limiting microporous insulation:

TABLE 1

Thermal conductivity of exemplary microporous insulation

| Temperature | | Thermal Conductivity | |
|---|---|---|---|
| Deg. F. | Deg. C. | Btu In/Sq Ft Hr F | W/m-K |
| 1600 | 871 | 0.4600 | 0.0066 |
| 1400 | 760 | 0.3900 | 0.0056 |
| 1200 | 649 | 0.3400 | 0.0049 |
| 1000 | 538 | 0.3000 | 0.0043 |
| 800 | 427 | 0.2600 | 0.0037 |
| 600 | 316 | 0.2300 | 0.0033 |
| 400 | 204 | 0.2200 | 0.0032 |
| 300 | 149 | 0.2100 | 0.0030 |

Without being bound to any particular theory, some insulation (including microporous insulations) may exhibit further improved performance when placed within an evacuated space A container according to the present disclosure may also be mounted within another container or frame to provide additional protection. A frame may comprise rigid materials, but may also include flexible or resilient materials, such as springs, elastomers, and the like. In this manner, a container according to the present disclosure may be suspendably mounted within a frame that provides additional mechanical protection to the container and the container's contents.

It should also be understood that an article may also be configured so as to place the interior of the article into thermal communication with the exterior of the article. This may be accomplished by, e.g., including a rod, wire, or other length of conductive material such that the conductive material extends from an exterior surface of the article into the article itself. This may be done in, e.g., applications where it may be desirable to transfer hear into or out of the interior of the article. The conductive material may be configured (e.g., by being slidable or otherwise shieldable) so that it may be switched between a first state where the conductive material places the exterior of the article into thermal communication with the interior of the article and a second state where the conductive material does not place the exterior of the article into thermal communication with the interior of the article.

This may be further described by reference to FIG. 1B. A structure according to the present disclosure may optionally include a thermal pathway (which may also be termed a "thermal short") that places an inner wall (e.g., wall 118 in FIG. 1B) into thermal communication with an outer wall (e.g., wall 110 in FIG. 1). The thermal pathway may be arranged such that the thermal pathway places an interior space of a device (e.g., the space enclosed by wall 118 in FIG. 1B) into thermal communication with the exterior of the device (e.g., wall 110 in FIG. 1B). This may be useful, e.g., in applications where a user may seek to communicate a low temperature from an area within a device (e.g., the area enclosed within wall 118 of FIG. 1B) to a location (e.g., a defined region on outer wall 110 of FIG. 1). As but one example, a device according to FIG. 1 might include liquid nitrogen within wall 118, which liquid nitrogen is maintained at a temperature of about 77 K. A conductive segment (not shown) then gives rise to a region of low temperature on outer wall 110, while the remainder of outer wall 110 remains at essentially ambient temperature. (A marking may be placed onto outer wall 110 to identify the region of low temperature.)

A thermal pathway may be created in a number of ways. In one embodiment, the thermal pathway comprises an amount of a conducting material (e.g., a post, a pillar) that bridges the walls that define an insulating space. As an example, a conductive segment (not shown) may span space 116 and place wall 118 into thermal communication with wall 110. The conductive segment suitably comprises a metal, e.g., copper, gold, iron, and the like. Metal alloys are also suitable for use as conductive segments. One may select for use in a conductive segment a material that has variable conductive characteristics depending on temperature. As one example, a user may select copper as the material for the conductive segment in applications where the device operation will be at a comparatively low temperature, as copper's conductive characteristics are especially good at low temperatures. It should be understood that a thermal pathway is optional, and a conductive segment is accordingly optional and need necessarily not be present. When present, the thermal pathway suitably has a thermal conductivity less than the thermal conductivity of the insulating space between the inner and outer walls, e.g., a thermal conductivity greater than that of the vacuum, insulation, or both that may be disposed between the inner and outer walls.

A thermal short might also be formed by contacting (e.g., via pinching, bending, or other mechanical process) wall 12 and outer wall 14. In this way, a user may form a vacuum-insulated article as described herein and then, via application of a pinching process, form a thermal short at one or more selected locations.

A thermal pathway may also be created (again by reference to FIG. 1B) by placement of a conductive segment between wall 118 and wall 110 wherein the conductive segment (not shown) is not long enough to place the inner and outer walls into thermal communication with one another. For example, the conductive segment may contact and extend from the wall 118 toward wall 110, but not also contact wall 110. Wall 110 may then be pinched or bent toward the conductive segment so as to place wall 110 into contact and thermal communication with the conductive segment. One or both walls may be bent or otherwise formed so as to form contact with a conductive segment.

It should be understood that a thermal pathway may be formed so as to place the exterior of a container or other article into fluid communication with any region within the article. For example, a thermal pathway may be constructed so as to place the exterior wall of the outermost (third) container of an article comprising three containers into thermal communication with a region that lies within the innermost (first) container of that article. Alternatively, a thermal pathway may place the exterior wall into thermal communication with a region that lies within the second (middle) container.

It should be further understood that an article according to the present disclosure may comprise one or more thermal pathways. For example, a first thermal pathway may place innermost and middle containers into thermal communication with one another. A second thermal pathway may then place the middle and outermost containers into thermal communication with one another.

EXEMPLARY EMBODIMENTS

The following embodiments are illustrative only and do not necessarily limit the scope of the present disclosure or the scope of the attached claims.

Embodiment 1

A multiply-insulated article, comprising:
a first container, the first container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the first container being, at a proximal end of the first container, open to the environment exterior to the first container, the vent of the first container opening in the direction of the proximal end of the first container; a second container, the second container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the second container being, at a proximal end of the second container, open to the environment exterior to the second container, the vent of the second container opening in the direction of the proximal end of the second container, the second container being disposed within the first container such that the proximal end of the second container is opposite the proximal end of the first container, the first container being disposed within the second container such that the first and second containers define a spacing therebetween; and a spacing material being disposed between the first and second containers so as to maintain the spacing between the first and second containers.

Embodiment 2

The article of Embodiment 1, further comprising a third container, the third container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the third container being, at a proximal end of the second container, open to the environment exterior to the third container, the third container being disposed with the second container such that the proximal end of the third container is opposite the proximal end of the second container, and the second container being disposed within the third container such that the second and third containers define a spacing therebetween; and a spacing material being disposed between the second and third containers so as to maintain the spacing between the first and third containers.

Embodiment 3

The article of any of Embodiments 1-2, wherein the spacing material comprises an epoxy, a silicone, a ceramic, a polymer, a microporous insulation, or any combination thereof.

Embodiment 4

The article of Embodiment 1, further comprising a conductor disposed so as to place the interior volume of the first container into electronic communication with the environment exterior to the second container.

Embodiment 5

The article of Embodiment 4, wherein at least a portion of the conductor is disposed within the spacing between the first and second containers.

Embodiment 6

The article of Embodiment 2, further comprising a conductor disposed so as to place the interior volume of the first container into electronic communication with the environment exterior to the third container.

Embodiment 7

The article of Embodiment 6, wherein at least a portion of the conductor is disposed within the spacing between the first and second containers.

Embodiment 8

The article of Embodiment 7, wherein at least a portion of the conductor is disposed within the spacing between the second and third containers.

Embodiment 9

The article of any of Embodiments 4-8, wherein the conductor comprises a wire.

Embodiment 10

The article of any of Embodiments 4-9, wherein the conductor is insulated.

Embodiment 11

The article of any of Embodiments 1-10, further comprising a device disposed within the article.

Embodiment 12

The article of any of Embodiments 1-11, wherein the interior volume of the first container is sealed against the environment exterior to the article.

Embodiment 13

The article of any of Embodiments 1-12, wherein the interior volume of the second container is sealed against the environment exterior to the article.

Embodiment 14

The article of any of Embodiments 1-13, wherein the interior volume of the third container is sealed against the environment exterior to the article.

Embodiment 15

The article of any of Embodiments 1-14, further comprising an inner container disposed within the interior volume of the first container.

Embodiment 16

The article of Embodiment 15, wherein the inner container comprises a chemically non-reactive material.

Embodiment 17

A method, comprising: with (a) a first container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the first container being, at a proximal end of the first container, open to the environment exterior to the first container, and the vent of the first container opening in the direction of the proximal end of the first container, and (b) a second container, the second container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the second container being, at a proximal end of the second container, open to the environment exterior to the second container, the vent of the second container opening in the direction of the proximal end of the second container, disposing the first container within the second container such that the proximal end of the second container is opposite the proximal end of the first container, disposing the first container within the second container such that the first and second containers define a spacing therebetween; disposing a spacing material between the first and second containers so as to maintain the spacing between the first and second containers; and disposing a conductor so as to place the interior of the first container into electronic communication with the environment exterior to the second container.

Embodiment 18

The method of Embodiment 17, further comprising sealing the interior of the first container against the environment exterior to the first container.

Embodiment 19

The method of any of Embodiments 17-18, further comprising sealing the interior of the second container against the environment exterior to the second container.

Embodiment 20

The method of any of Embodiments 17-19, further comprising disposing a third container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the third container being, at a proximal end of the second container, open to the environment exterior to the third container, such that the third container is disposed with the second container such that the proximal end of the third container is opposite the proximal end of the second container, such that the second container being disposed within the third container such that the second and third containers define a spacing therebetween; and disposing a spacing material being disposed between the second and third containers so as to maintain the spacing between the second and third containers.

Embodiment 21

The method of Embodiment 20, wherein the conductor places the interior of the first container into electronic communication with the environment exterior to the third container.

Embodiment 22

The method of any of Embodiments 20-21, wherein the spacing material comprises an epoxy, a silicone, a ceramic, a polymer, a microporous insulation, or any combination thereof.

Embodiment 23

A module, comprising: a first container having an opening and comprising inner and outer walls and defining a sealed region between the inner and outer walls, the sealed region having a pressure of from about $10^{-5}$ to about $10^{-9}$ Torr, the first container having an opening; a second container having an opening and comprising inner and outer walls and defining a sealed region between the inner and outer walls, the sealed region having a pressure of from about $10^{-5}$ to about $10^{-9}$ Torr, the second container being disposed within the first container and the second container's opening being disposed opposite the opening of the first container; the first and second containers defining a space therebetween and enclosing a storage volume within the second container, the space between the first and second containers being occupied by an insulator, the storage volume having disposed within a data recorder, the data recorder being enclosed in the storage volume within an amount of insulator, within an amount of a phase change material, or both.

Embodiment 24

The module of Embodiment 22, further comprising a container that sealably encloses the first and second containers.

Embodiment 25

The module of Embodiment 23, wherein the container is separable into at least first and second parts.

Embodiment 26

The module of any of Embodiments 23-25, wherein the insulator comprises a microporous insulation.

What is claimed:
1. A multiply-insulated article, comprising:
a first container, the first container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the first container being, at a proximal end of the first container, open to the environment exterior to the first container, the vent of the first container opening in the direction of the proximal end of the first container;

a second container, the second container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the second container being, at a proximal end of the second container, open to the environment exterior to the second container, the vent of the second container opening in the direction of the proximal end of the second container, the first container being disposed within the second container such that the proximal end of the second container is opposite the proximal end of the first container, the first container being disposed within the second container such that the first and second containers define a spacing therebetween; and a spacing material being disposed between the first and second containers so as to maintain the spacing between the first and second containers.

2. The article of claim 1, further comprising a third container, the third container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the third container being, at a proximal end of the second container, open to the environment exterior to the third container, the second container being disposed within the third container such that the proximal end of the third container is opposite the proximal end of the second container, and the second container being disposed within the third container such that the second and third containers define a spacing therebetween; and a spacing material being disposed between the second and third containers so as to maintain the spacing between the first and third containers.

3. The article of claim 2, further comprising a conductor disposed so as to place the interior volume of the first container into electronic communication with the environment exterior to the third container.

4. The article of claim 3, wherein at least a portion of the conductor is disposed within the spacing between the first and second containers.

5. The article of claim 4, wherein at least a portion of the conductor is disposed within the spacing between the second and third containers.

6. The article of claim 2, wherein the interior volume of the third container is sealed against the environment exterior to the article.

7. The article of claim 1, wherein the spacing material comprises an epoxy, a silicone, a ceramic, a polymer, a microporous insulation, or any combination thereof.

8. The article of claim 1, further comprising a conductor disposed so as to place the interior volume of the first container into electronic communication with the environment exterior to the second container.

9. The article of claim 8, wherein at least a portion of the conductor is disposed within the spacing between the first and second containers.

10. The article of claim 8, wherein the conductor comprises a wire.

11. The article of claim 8, wherein the conductor is insulated.

12. The article of claim 1, further comprising a device disposed within the article.

13. The article of claim 1, wherein the interior volume of the first container is sealed against the environment exterior to the article.

14. The article of claim 1, wherein the interior volume of the second container is sealed against the environment exterior to the article.

15. The article of claim 1, further comprising an inner container disposed within the interior volume of the first container.

16. The article of claim 15, wherein the inner container comprises a chemically non-reactive material.

17. A method, comprising:
(a) providing a first container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the first container being, at a proximal end of the first container, open to the environment exterior to the first container, and the vent of the first container opening in the direction of the proximal end of the first container, and (b) providing a second container, the second container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the second container being, at a proximal end of the second container, open to the environment exterior to the second container, the vent of the second container opening in the direction of the proximal end of the second container, disposing the first container within the second container such that the proximal end of the second container is opposite the proximal end of the first container, disposing the first container within the second container such that the first and second containers define a spacing therebetween;

disposing a spacing material between the first and second containers so as to maintain the spacing between the first and second containers; and disposing a conductor so as to place the interior of the first container into electronic communication with the environment exterior to the second container.

18. The method of claim 17, further comprising sealing the interior of the first container against the environment exterior to the first container.

19. The method of claim 17, further comprising sealing the interior of the second container against the environment exterior to the second container.

20. The method of claim 17, further comprising providing a third container comprising a first wall enclosing an interior volume; a second wall enclosing the first wall and the second wall being spaced at a distance from the first wall to define an insulating space therebetween; and a vent communicating with the insulating space to provide an exit pathway for gas molecules from the space, the vent being sealable for maintaining a vacuum within the insulating space following evacuation of gas molecules through the vent, the distance between the first and second walls being variable in a portion of the insulating space adjacent the vent such that gas molecules within the insulating space are directed towards the vent by the variable-distance portion of the first and second walls during the evacuation of the insulating space, the interior volume of the third container being, at a proximal end of the second container, open to the environment exterior to the third container, such that the second container is disposed within the third container such that the proximal end of the third container is opposite the proximal end of the second container, such that the second container being disposed within the third container such that the second and third containers define a spacing therebetween; and disposing a spacing material being disposed between the second and third containers so as to maintain the spacing between the second and third containers.

21. The method of claim 20, wherein the conductor places the interior of the first container into electronic communication with the environment exterior to the third container.

22. The method of claim 20, wherein the spacing material comprises an epoxy, a silicone, a ceramic, a polymer, a microporous insulation, or any combination thereof.

23. A module, comprising:

a first container having an opening and comprising inner and outer walls and defining a sealed region between the inner and outer walls, the sealed region having a pressure of from about $10^{-5}$ to about $10^{-9}$ Torr, the first container having an opening;

a second container having an opening and comprising inner and outer walls and defining a sealed region between the inner and outer walls, the sealed region having a pressure of from about $10^{-5}$ to about $10^{-9}$ Torr, the second container being disposed within the first container and the opening of the second container being disposed opposite the opening of the first container;

the first and second containers defining a space therebetween and enclosing a storage volume within the second container, the space between the first and second containers being occupied by an insulator, the storage volume having disposed within a data recorder, the data recorder being enclosed in the storage volume within an amount of insulator, within an amount of a phase change material, or both.

24. The module of claim 23, further comprising an outer container that sealably encloses the first and second containers.

25. The module of claim 24, wherein the outer container is separable into at least first and second parts.

26. The module of claim 23, wherein the insulator comprises a microporous insulation.

* * * * *